United States Patent
Pritchard et al.

(10) Patent No.: US 12,501,624 B1
(45) Date of Patent: Dec. 16, 2025

(54) MEMORY DEVICE STRUCTURES THAT INCLUDE A CAPACITOR

(71) Applicant: GlobalFoundries U.S. Inc., Malta, NY (US)

(72) Inventors: David Pritchard, Glenville, NY (US); Brenda Lanza, Austin, TX (US); Galla Kiran Kumar, Ongole (IN); Romain Feuillette, Williston, VT (US); Navneet Jain, Milpitas, CA (US); Hong Yu, Clifton Park, NY (US); Heather Lazar, Saratoga Springs, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/938,407

(22) Filed: Nov. 6, 2024

(30) Foreign Application Priority Data

Sep. 25, 2024 (IN) .............................. 202411072480

(51) Int. Cl.
| | |
|---|---|
| *H10B 53/10* | (2023.01) |
| *H10B 53/30* | (2023.01) |
| *H10D 1/00* | (2025.01) |
| *H10D 1/68* | (2025.01) |

(52) U.S. Cl.
CPC .............. *H10B 53/30* (2023.02); *H10B 53/10* (2023.02); *H10D 1/042* (2025.01); *H10D 1/714* (2025.01)

(58) Field of Classification Search
CPC ... H01L 24/75; B23K 3/0623; B23K 2101/40; G05B 19/19; G05B 2219/45029; H10B 24/20; H10D 1/042; H10D 1/714
See application file for complete search history.

(56) References Cited

U.S. PATENT DOCUMENTS

| | | | | |
|---|---|---|---|---|
| 4,794,434 | A | * | 12/1988 | Pelley, III .............. H10B 12/37 257/E27.092 |
| 5,567,966 | A | * | 10/1996 | Hwang .............. H10D 30/6715 257/E29.147 |
| 6,521,938 | B2 | | 2/2003 | Hamamoto |
| 9,761,580 | B1 | | 9/2017 | Ramaswamy |

(Continued)

FOREIGN PATENT DOCUMENTS

| | | |
|---|---|---|
| KR | 19990071432 A | 9/1999 |
| WO | 2019132890 A1 | 7/2019 |

OTHER PUBLICATIONS

W. Chakraborty et al., "Pseudo-Static 1T Capacitorless DRAM using 22nm FDSOI for Cryogenic Cache Memory," 2021 IEEE International Electron Devices Meeting (IEDM), San Francisco, CA, USA, 2021, pp. 40.1.1-40.1.4, doi: 10.1109/IEDM19574.2021.9720578.

(Continued)

*Primary Examiner* — Mohammad M Choudhry
(74) *Attorney, Agent, or Firm* — Thompson Hine LLP

(57) ABSTRACT

Structures for a memory device and methods of forming a structure for a memory device. The structure comprises a first transistor including a first gate structure and a first source/drain region, a second transistor including a second gate structure and a second source/drain region, and a capacitor including a first capacitor plate directly coupled to the first source/drain region, a second capacitor plate, and a capacitor dielectric layer between the first capacitor plate and the second capacitor plate.

20 Claims, 15 Drawing Sheets

(56) References Cited

U.S. PATENT DOCUMENTS

| | | |
|---|---|---|
| 10,727,108 B2 | 7/2020 | Pritchard et al. |
| 11,610,843 B2 | 3/2023 | Ren et al. |
| 2001/0032991 A1 | 10/2001 | Hofmann |
| 2001/0050388 A1* | 12/2001 | Hamamoto .......... H10B 12/488 |
| | | 257/E21.651 |
| 2016/0163711 A1* | 6/2016 | Arndt ................ H01L 21/30617 |
| | | 438/387 |
| 2024/0114697 A1 | 4/2024 | Shivaraman et al. |
| 2024/0120373 A1 | 4/2024 | Yu et al. |

OTHER PUBLICATIONS

X. Liu et al., "A three-dimensional DRAM using floating body cell in FDSOI devices," 2012 IEEE 15th International Symposium on Design and Diagnostics of Electronic Circuits & Systems (DDECS), Tallinn, Estonia, 2012, pp. 159-162, doi: 10.1109/DDECS.2012.6219044.

Y. Horii et al., "4 Mbit embedded FRAM for high performance System on Chip (SoC) with large switching charge, reliable retention and high imprint resistance," Digest. International Electron Devices Meeting,, San Francisco, CA, USA, 2002, pp. 539-542, doi: 10.1109/IEDM.2002.1175898.

Pritchard, David et al., "Lateral Capacitors of Semiconductor Devices" filed on Jan. 9, 2023 as a U.S. Appl. No. 18/151,509.

European Patent Office, Partial European Search Report and Opinion issued in European Patent Application No. 25163372.3 on Aug. 20, 2025; 16 pages.

European Patent Office, Extended European Search Report and Opinion issued in European Patent Application No. 25163372.3 on Oct. 23, 2025; 16 pages.

\* cited by examiner

MEMORY DEVICE STRUCTURES THAT INCLUDE A CAPACITOR

BACKGROUND

The disclosure relates to semiconductor device fabrication and integrated circuits and, more specifically, to structures for a memory device and methods of forming a structure for a memory device.

Non-volatile memory devices are utilized in various electronic products for applications such as general storage and transfer of data. Stored data is retained by a non-volatile memory device when the memory cells are not powered. The persistence of data storage by non-volatile memory devices contrasts with volatile memory technologies, such as a static random-access memory (SRAM) device in which stored data is eventually lost when the memory cells are unpowered and a dynamic random-access memory (DRAM) device in which stored data is lost if the memory cells are not periodically refreshed. Conventional non-volatile memory devices have footprints that occupy large chip areas, which imposes a restriction on their application in electronic products.

Improved structures for a memory device and methods of forming a structure for a memory device are needed.

SUMMARY

In an embodiment of the invention, a structure for a memory device is provided. The structure comprises a first transistor including a first gate structure and a first source/drain region, a second transistor including a second gate structure and a second source/drain region, and a capacitor including a first capacitor plate directly coupled to the first source/drain region, a second capacitor plate, and a capacitor dielectric layer between the first capacitor plate and the second capacitor plate.

In an embodiment of the invention, a structure for a memory device is provided. The structure comprises a silicon-on-insulator substrate including a semiconductor substrate, a dielectric layer on the semiconductor substrate, and a semiconductor layer on the dielectric layer. The dielectric layer adjoins the semiconductor substrate along an interface. The structure further comprises a transistor including a gate structure and a source/drain region in the semiconductor layer, and a capacitor including a first capacitor plate adjacent to the interface, a second capacitor plate, and a capacitor dielectric layer between the first capacitor plate and the second capacitor plate. The structure further comprises a conductor layer that extends from the source/drain region through the dielectric layer to the first capacitor plate.

In an embodiment of the invention, a method of forming a structure for a memory device is provided. The method comprises forming a first transistor including a first gate structure and a first source/drain region, forming a second transistor including a second gate structure and a second source/drain region, and forming a capacitor including a first capacitor plate directly coupled to the first source/drain region, a second capacitor plate, and a capacitor dielectric layer between the first capacitor plate and the second capacitor plate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
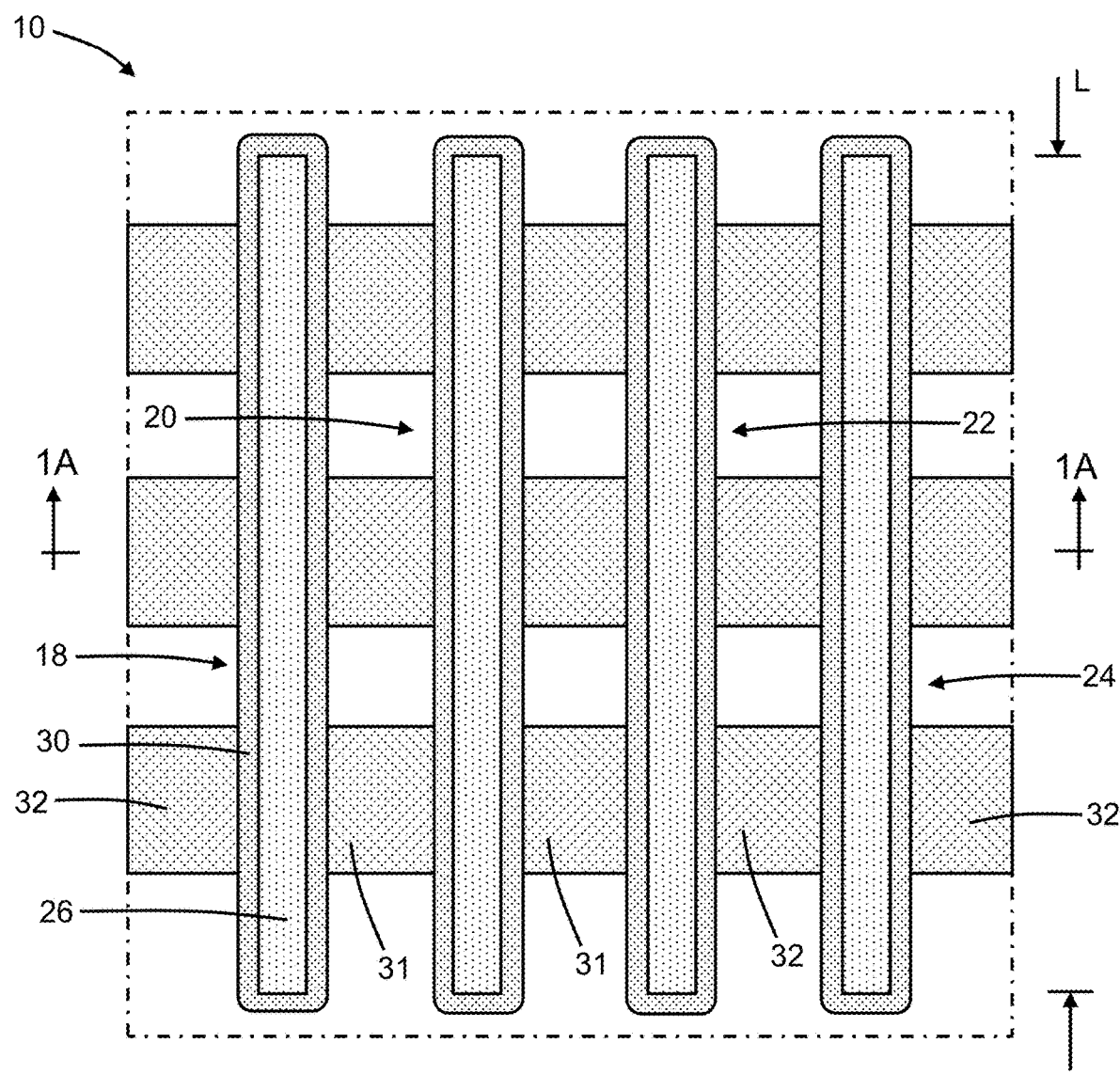
FIG. 1 is a cross-sectional view of a structure at an initial fabrication stage of a processing method in accordance with embodiments of the invention.
Figure 1A:
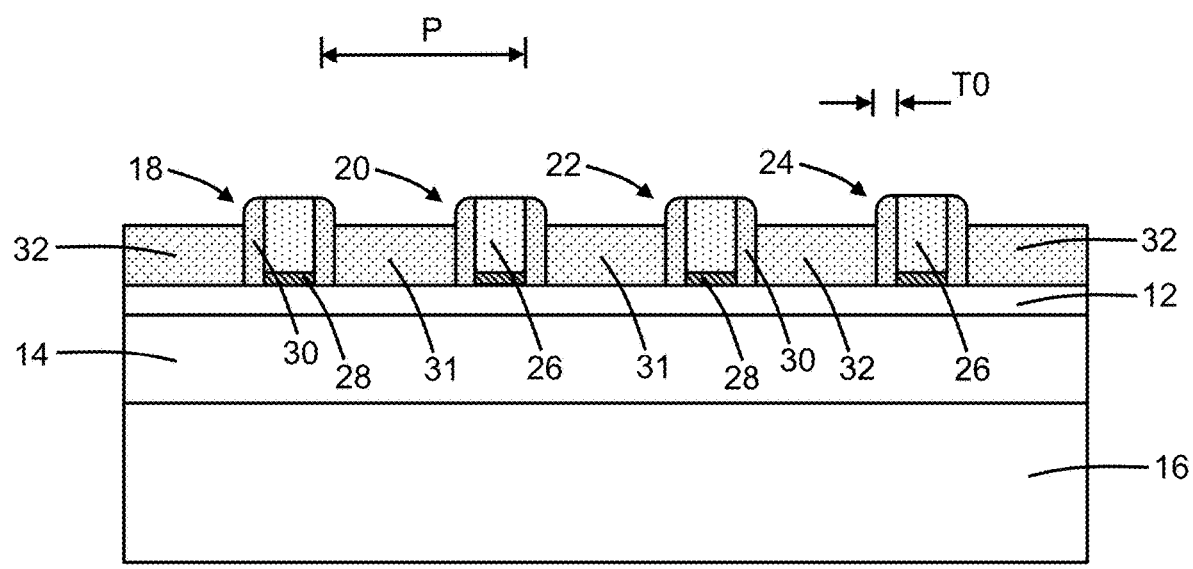
FIG. 1A is a cross-sectional view taken generally along line 1A-1A in FIG. 1.

With reference to FIGS. 1, 1A and in accordance with embodiments of the invention, a structure 10 for a memory device may be fabricated using a silicon-on-insulator substrate that includes a semiconductor layer 12, a semiconductor substrate 16, and a dielectric layer 14 disposed between the semiconductor layer 12 and the semiconductor substrate 16. The semiconductor layer 12 may be comprised of a semiconductor material, such as single-crystal silicon. The dielectric layer 14 may be comprised of a dielectric material, such as silicon dioxide, that is an electrical insulator. The semiconductor substrate 16 may be comprised of a semiconductor material, such as single-crystal silicon, that is lightly doped to have, for example, p-type conductivity. The semiconductor layer 12, which is physically separated and electrically isolated from the semiconductor substrate 16 by the intervening dielectric layer 14, may be significantly thinner than the semiconductor substrate 16. The dielectric layer 14 has a lower interface with the semiconductor substrate 16 and an upper interface with the semiconductor layer 12.

In an embodiment, the dielectric layer 14 may be a buried oxide layer of a silicon-on-insulator substrate, the semiconductor layer 12 may be a device layer of the silicon-oninsulator substrate, and the buried oxide layer provided by the dielectric layer 14 may separate the device layer provided by the semiconductor layer 12 from the semiconductor substrate 16. In an embodiment, the semiconductor layer 12 of the silicon-on-insulator substrate may have a thickness suitable to fabricate fully-depleted silicon-on-insulator device structures. In an embodiment, the semiconductor layer 12 may have a thickness in a range of about 4 nanometers to about 20 nanometers.

Gate structures 18, 20, 22, 24 may be formed on the top surface of the semiconductor layer 12 with a given pitch P. Each of the gate structures 18, 20, 22, 24 includes a gate electrode 26 and a gate dielectric layer 28. A dielectric spacer 30 that surrounds the gate electrode 26 and gate dielectric layer 28 of each of the gate structures 18, 20, 22, 24. The gate electrode 26 may be comprised of a conductor, such as doped polycrystalline silicon, the gate dielectric layer 28 may be comprised of a dielectric material, such as silicon dioxide, that is an electrical insulator, and the dielectric spacer 30 may be comprised of a dielectric material, such as silicon nitride, that is an electrical insulator. Silicide-blocking layers (not shown) may be formed on a top surface of each gate electrode 26. Each of the gate structures 18, 20, 22, 24 has a length L measured along its longest dimension, and the dielectric spacers 30 may have a thickness T0.

Semiconductor layers 31, 32 may be formed on the top surface of the semiconductor layer 12 in the spaces between the gate structures 18, 20, 22, 24. The dielectric spacers 30 electrically isolate the semiconductor layers 31, 32 from the gate structures 18, 20, 22, 24. The semiconductor layers 31, 32 may provide raised source/drain regions of the structure 10. Portions of the semiconductor layer 12 beneath the semiconductor layers 31, 32 may receive diffused dopant from the semiconductor layers 31, 32 and provide source/drain regions in the semiconductor layer 12. As used herein, the term "source/drain region" means a region of semiconductor material that can function as either a source or a drain of a field-effect transistor. The semiconductor layers 31, 32 may be comprised of single-crystal semiconductor material, such as silicon or silicon-germanium, formed by an epitaxial growth process. As used herein, a single-crystal semiconductor material is characterized by a continuous crystal lattice and the absence of grain boundaries. The single-crystal semiconductor material of the semiconductor layer 12 has a crystal structure that serves as a crystalline template during epitaxial growth for the crystal structure of the single-crystal semiconductor material of the semiconductor layers 31, 32. In an embodiment, the semiconductor layers 31, 32 may be doped during epitaxial growth with a concentration of an n-type dopant, such as arsenic or phosphorus, that provides p-type conductivity. In an alternative embodiment, the semiconductor layers 31, 32 may be doped during epitaxial growth with a concentration of a p-type dopant, such as boron, that provides p-type conductivity.

Figure 2:
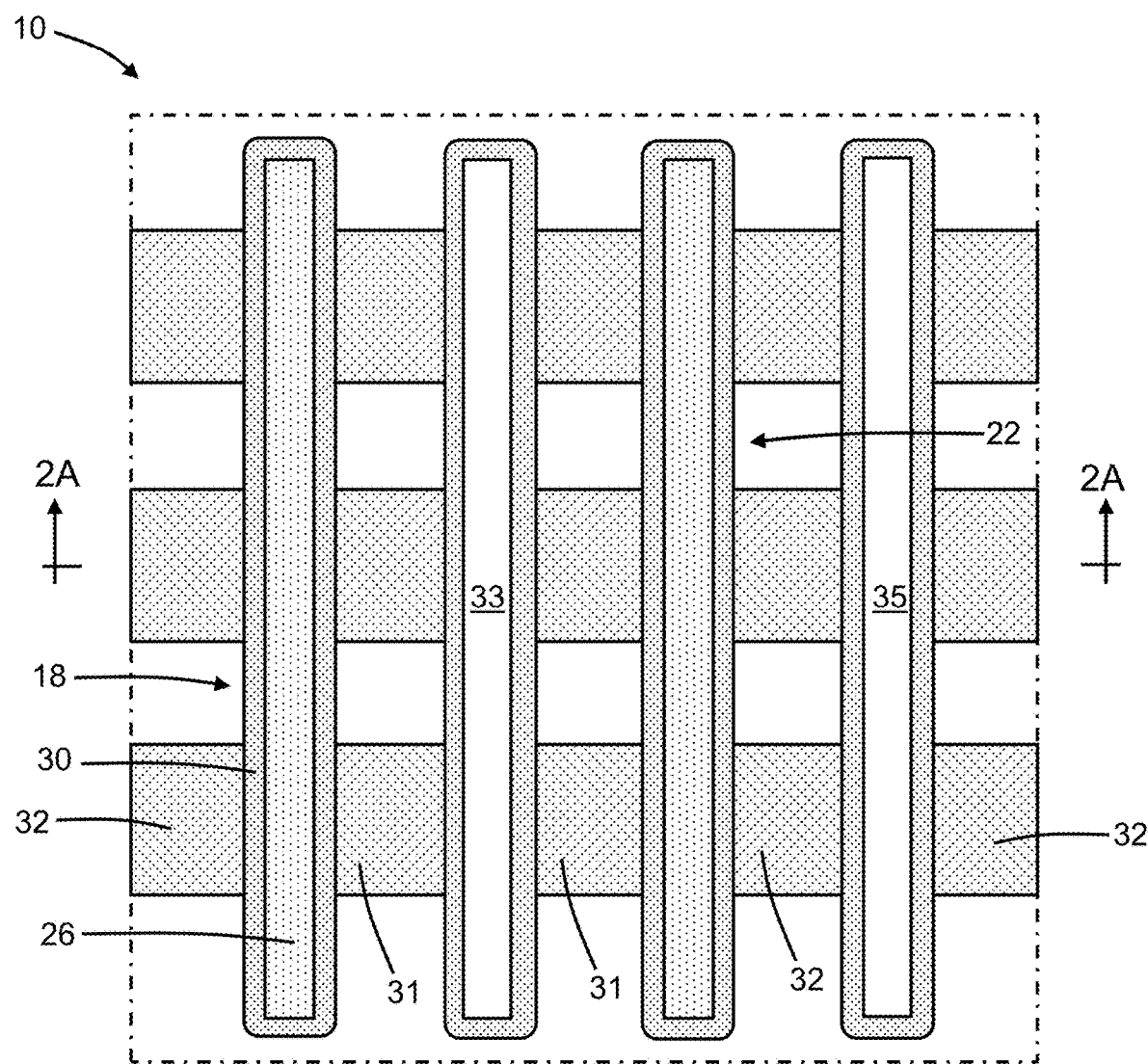
FIG. 2 is a top view of the structure at a fabrication stage of the processing method subsequent to FIGS. 1, 1A.
Figure 2A:
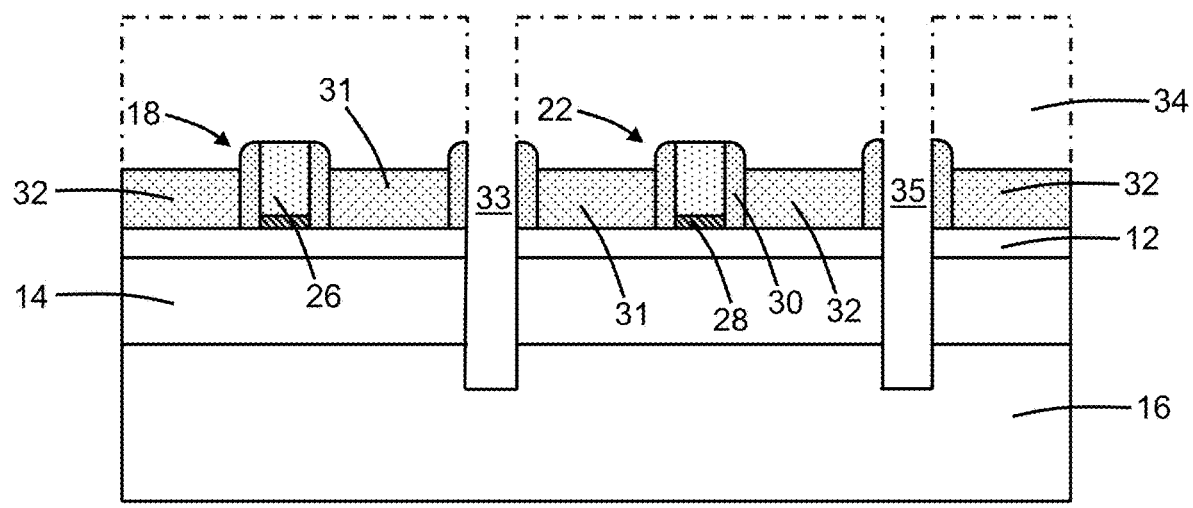
FIG. 2A is a cross-sectional view taken generally along line 2A-2A in FIG. 2.

With reference to FIGS. 2, 2A in which like reference numerals refer to like features in FIGS. 1, 1A and at a subsequent fabrication stage, a dielectric layer 34 may be formed over the gate structures 18, 20, 22, 24 and semiconductor layers 31, 32. For example, the dielectric layer 34 may be comprised of a dielectric material, such as silicon dioxide, that is deposited and planarized. The dielectric layer 34 may be patterned by lithography and etching processes to form openings that expose the gate structure 20 and the gate structure 24. A trench 33 may be formed by removing the gate structure 20, and portions of the semiconductor layer 12 and dielectric layer 14 below the removed gate structure 20. The trench 33 extends through the dielectric layer 34, the semiconductor layer 12, and the dielectric layer 14, and into the semiconductor substrate 16. A trench 35 may be formed by removing the gate structure 24, and portions of the semiconductor layer 12 and dielectric layer 14 below the removed gate structure 24 and dielectric spacer 30. The trench 35 extends through the dielectric layer 34, the semiconductor layer 12, and the dielectric layer 14, and into the semiconductor substrate 16.

The trench 33 is laterally positioned between the semiconductor layers 31 and the doped portions of the semiconductor layer 12 beneath the semiconductor layers 31. A portion of the trench 33 is surrounded by the dielectric spacer 30 associated with the removed gate structure 20. A portion of the trench 35 is also surrounded by the dielectric spacer 30 associated with the gate structure 24.

Figure 3:
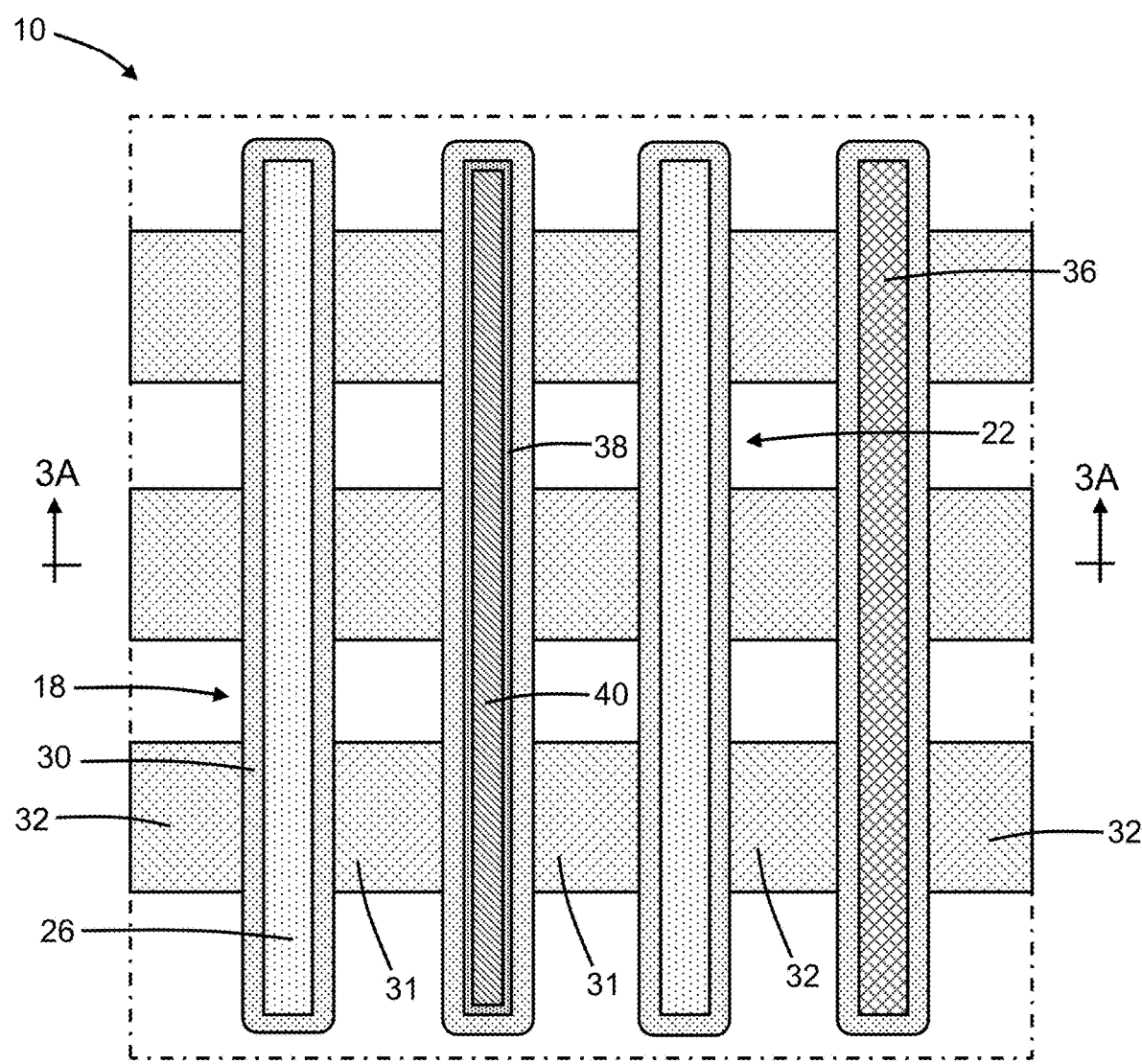
FIG. 3 is a top view of the structure at a fabrication stage of the processing method subsequent to FIGS. 2, 2A.
Figure 3A:
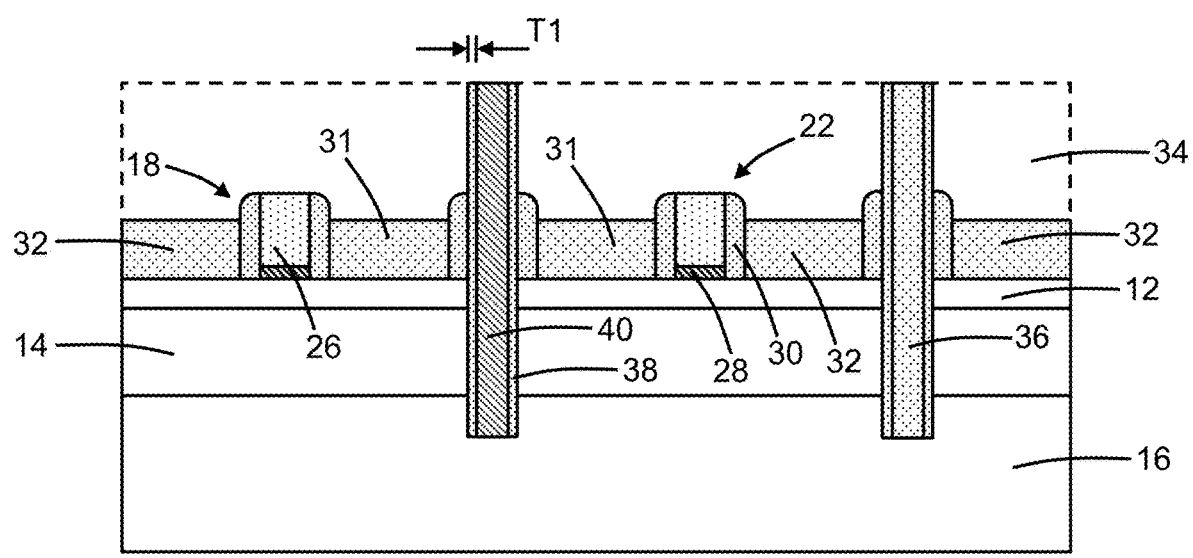
FIG. 3A is a cross-sectional view taken generally along line 3A-3A in FIG. 3.

With reference to FIGS. 3, 3A in which like reference numerals refer to like features in FIGS. 2, 2A and at a subsequent fabrication stage, the trench 35 may be filled by a dielectric layer 36 comprised of a dielectric material, such as silicon dioxide, to provide a single diffusion break. The trench 33 may be temporarily filled by a removable fill, such as an organic dielectric layer, that is removed, after forming the dielectric layer 36, to reopen the trench 33.

The trench 33 may be filled by a dielectric layer 38 and a conductor layer 40 of a trench capacitor. The conductor layer 40 is disposed as a core layer inside of the dielectric layer 38. The conductor layer 40 has a sidewall 41 and the dielectric layer 38 surrounds the sidewall 41 of the conductor layer 40 as a liner. Portions of the dielectric layer 38 are disposed between the portions of the conductor layer 40 and the semiconductor layers 31, as well as between the portions of the conductor layer 40 and the portions of the semiconductor layer 12 beneath the semiconductor layers 31. The dielectric layer 38 may have a thickness T1. A portion of the dielectric layer 34 and a portion of the conductor layer 40 are surrounded by the dielectric spacer 30 associated with the removed gate structure 20.

In an embodiment, the dielectric layer 38 may be comprised of a dielectric material that is electrically insulating. In an embodiment, the dielectric layer 38 may be comprised of a high-k dielectric material, such as hafnium oxide, titanium oxide, zirconium oxide, tantalum oxide, or strontium titanate, characterized by a dielectric constant greater than about 20. In an alternative embodiment, the dielectric layer 38 may be comprised of silicon dioxide. Forming the dielectric layer 38 from a high-K dielectric material may promote increased capacitance and retention time. The conductor layer 40 may be comprised of a material, such as doped amorphous silicon or tungsten, that is an electrical conductor. The conductor layer 40 may have the length L of the gate structures 18, 20, 22, 24.

In an embodiment, the portion of the dielectric layer 38 coating the bottom of the trench 33 may be removed before forming the conductor layer 40 such that the conductor layer 40 includes a bottom portion that is in physical and electrical contact with the semiconductor substrate 16. The same etching process may remove portions of the dielectric material of the dielectric layer 38 from the top surface of the dielectric layer 34.

Figure 4:
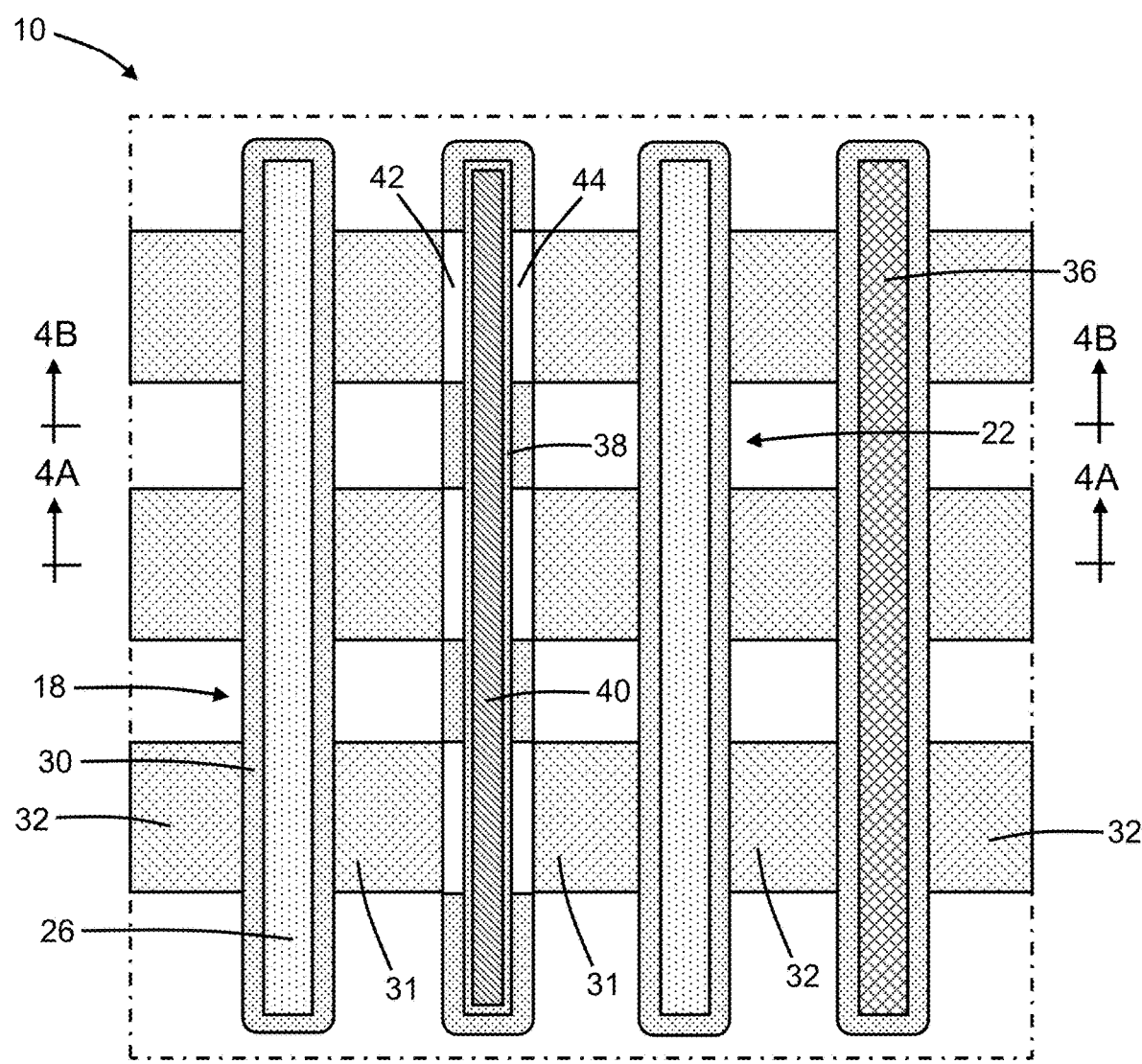
FIG. 4 is a top view of the structure at a fabrication stage of the processing method subsequent to FIGS. 3, 3A.
Figure 4A:
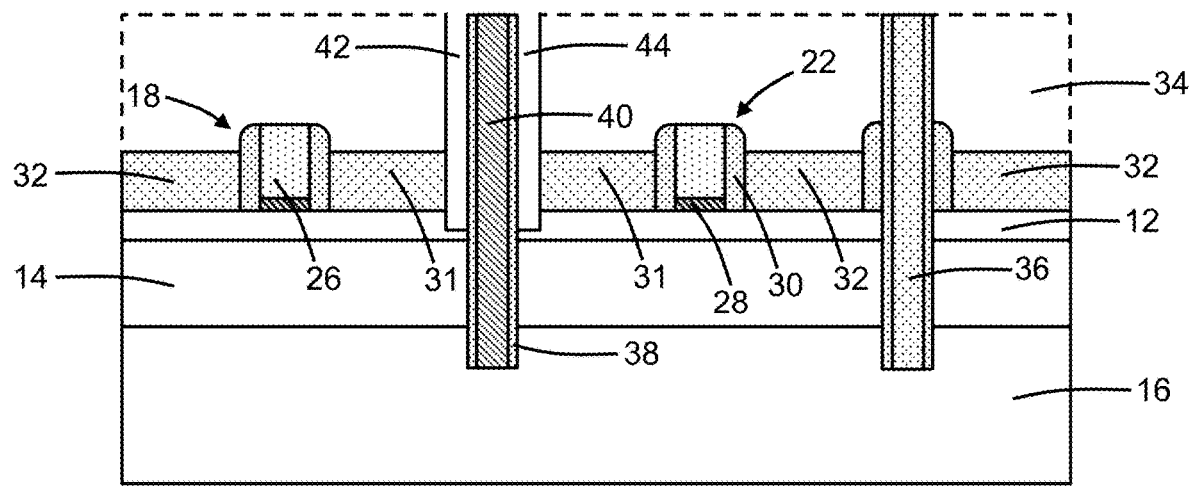
FIG. 4A is a cross-sectional view taken generally along line 4A-4A in FIG. 4.
Figure 4B:
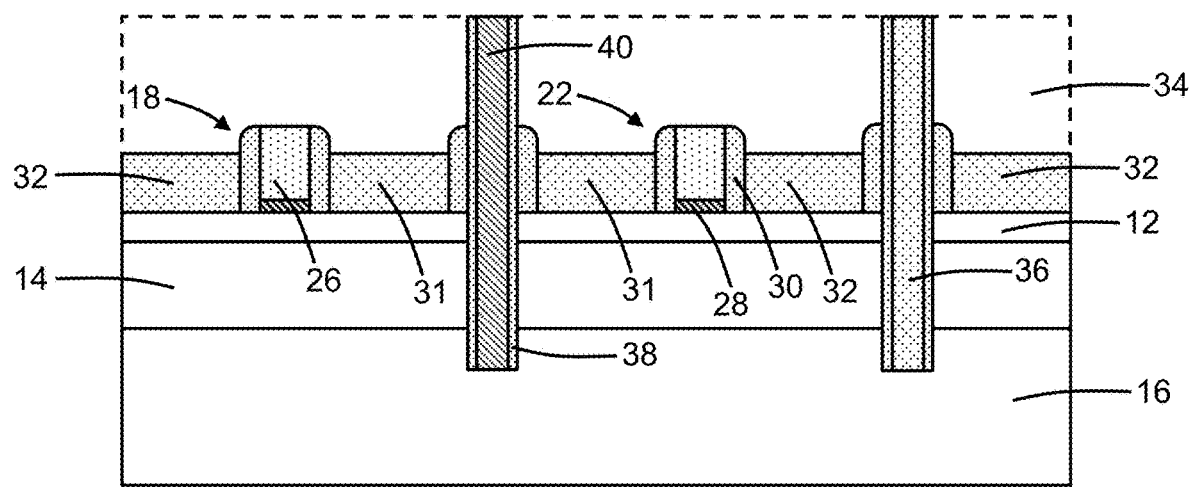
FIG. 4B is a cross-sectional view taken generally along line 4B-4B in FIG. 4.

With reference to FIGS. 4, 4A, 4B in which like reference numerals refer to like features in FIGS. 3, 3A and at a subsequent fabrication stage, trenches 42 and trenches 44 may be formed in respective pairs along the length of the trench 33 including the dielectric layer 38 and the conductor layer 40. The formation of the trenches 42, 44 removes respective sections of the dielectric spacer 30 surrounding the dielectric layer 38 and the conductor layer 40, as well as portions of the semiconductor layer 12 beneath the removed sections of the dielectric spacer 30. In an embodiment, the material of the dielectric spacer 30 may be removed selective to the materials of the dielectric layer 38 and the conductor layer 40. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The removed sections of the dielectric spacer 30 are correlated with the locations of the source/drain regions provided by the semiconductor layers 31, 32 and the portions of the semiconductor layer 12 beneath the semiconductor layers 31, 32. In an embodiment, the trenches 42, 44 may penetrate partially through the thickness of the semiconductor layer 12.

Figure 5:
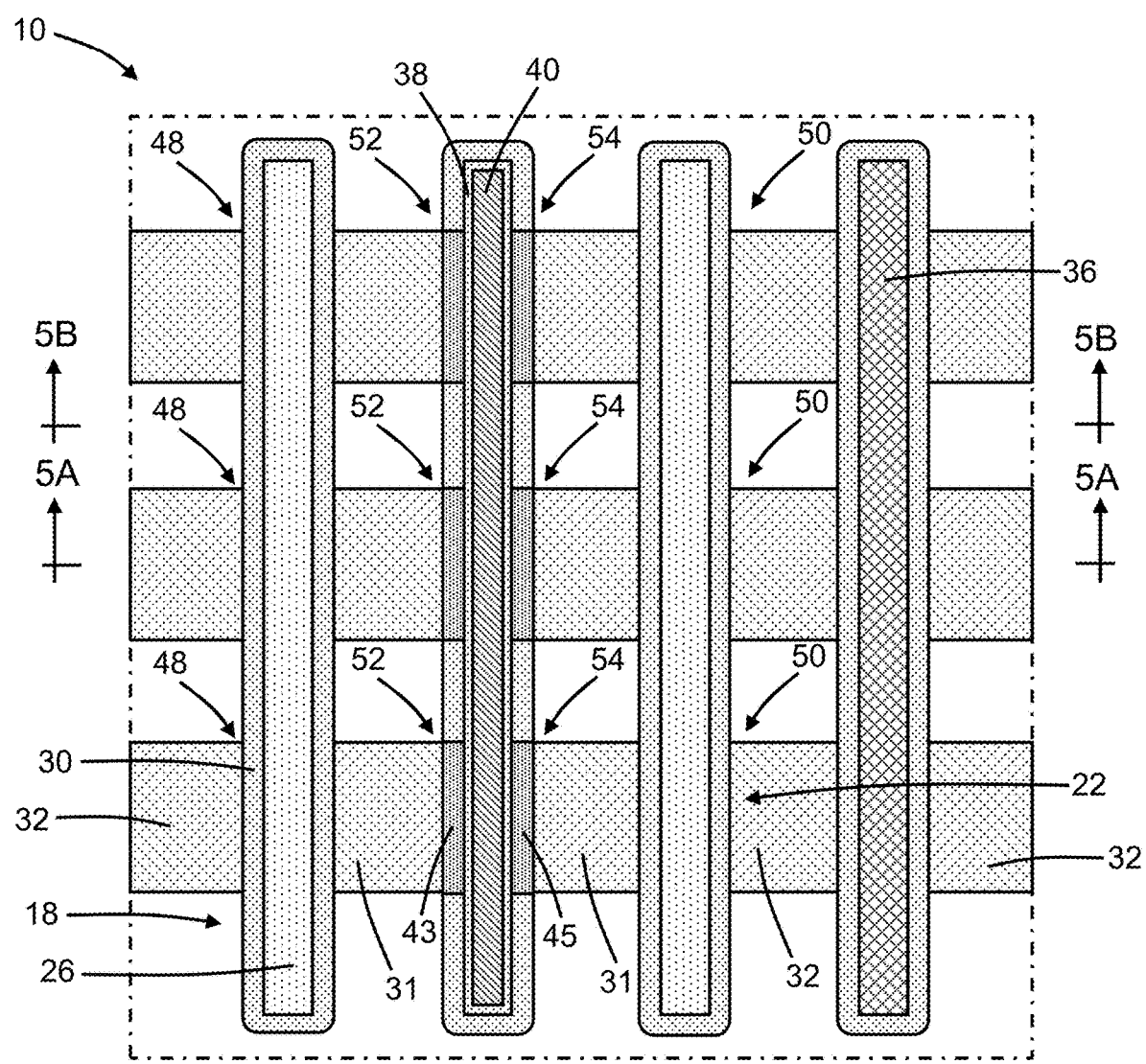
FIG. 5 is a top view of the structure at a fabrication stage of the processing method subsequent to FIGS. 4, 4A, 4B.
Figure 5A:
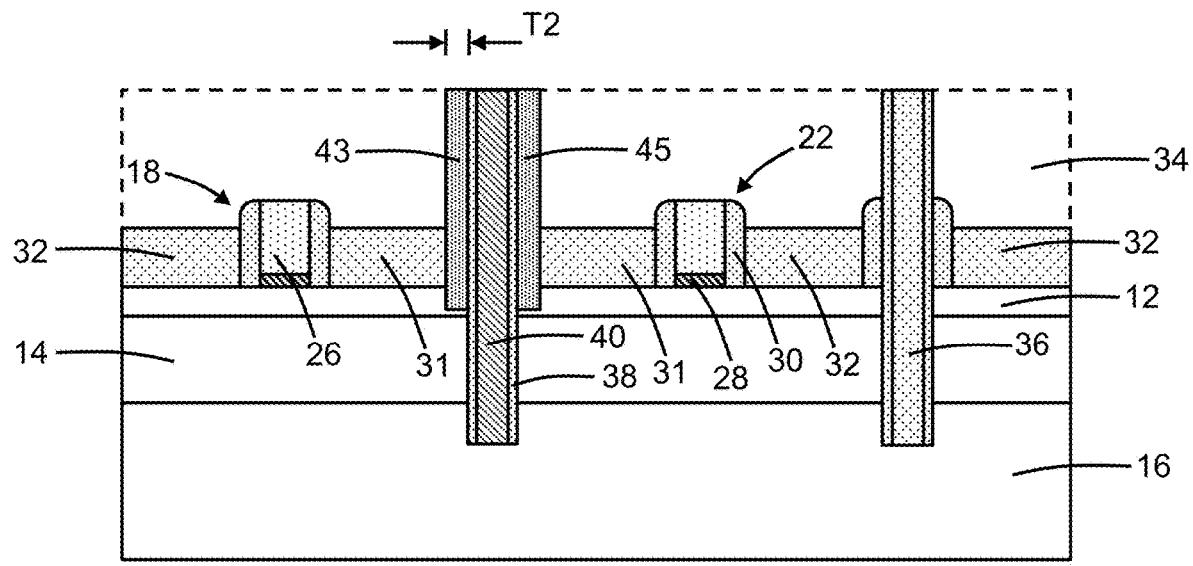
FIG. 5A is a cross-sectional view taken generally along line 5A-5A in FIG. 5.
Figure 5B:
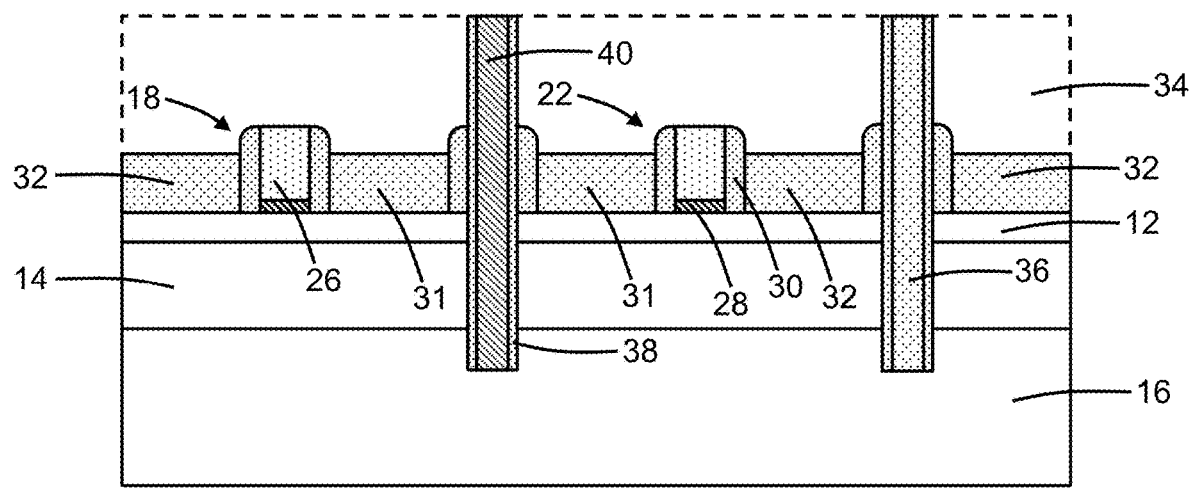
FIG. 5B is a cross-sectional view taken generally along line 5B-5B in FIG. 5.

With reference to FIGS. 5, 5A, 5B in which like reference numerals refer to like features in FIGS. 4, 4A, 4B and at a subsequent fabrication stage, the trenches 42 may be filled by respective sections of a conductor layer 43 and the trenches 44 may be filled by respective sections of a conductor layer 45. The conductor layers 43, 45 may be comprised of a material, such as doped silicon or titanium, that is an electrical conductor. In an embodiment, the conductor layers 43, 45 may be deposited and planarized by chemical-mechanical polishing. In an embodiment, the conductor layers 43, 45 may be formed by an epitaxial grown process. Sections of the dielectric spacer 30 are positioned as dielectric layers of electrically-insulating dielectric material between the sections of the conductor layer 43, and sections of the dielectric spacer 30 are also positioned as dielectric layers of electrically-insulating dielectric material between the sections of the conductor layer 45. The conductor layers 43, 45 are spaced along the length of the conductor layer 40.

The structure 10 includes multiple transistors 48 that are associated with the gate structure 18 and the semiconductor layers 31, 32 flanking the gate structure 18, as well as multiple transistors 50 that are associated with the gate structure 22 and the semiconductor layers 31, 32 flanking the gate structure 22. The structure 10 further includes multiple capacitors 52 that are respectively associated with the transistors 48 and multiple capacitors 54 that are respectively associated with the transistors 50. The capacitors 52 and the capacitors 54 share the conductor layer 40 as a capacitor plate or electrode and share the dielectric layer 38 as a capacitor dielectric layer. Each capacitor 52 includes one of the conductor layers 43 as a capacitor plate or electrode that is separated from a portion of the conductor layer 40 by a portion of the dielectric layer 38. Each capacitor 54 includes one of the conductor layers 45 as a capacitor plate or electrode that is separated from a portion of the conductor layer 40 by a portion of the dielectric layer 38. The patterned sections of the dielectric spacer 30 supply dielectric layers providing electrical isolation between the adjacent sections of the conductor layer 43 of the capacitors 52 and the adjacent sections of the conductor layer 45 of the capacitors 54. Each conductor layer 43 and each conductor layer 45 may have a thickness T2 that is substantially equal to the thickness T0 of the dielectric spacers 30.

Each pairing of the capacitors 52 and the transistors 48 may define a memory cell of a memory device, and each pairing of the capacitors 54 and the transistors 50 may define a memory cell of the memory device. The memory cells including the capacitors 52, 54 and the transistors 48, 50 may be deployed in memory device that includes a larger array of memory cells.

The capacitance of the capacitors 52, 54 may be increased or decreased in proportion to the height of the conductor layers 43, 45. The height of the conductor layers 43, 45 may be adjusted by recessing the conductor layers 43, 45 within the trenches 42, 44. The capacitance of the capacitors 52, 54 may be increased or decreased in inverse proportion to the thickness T1 of the dielectric layer 38.

Figure 6:
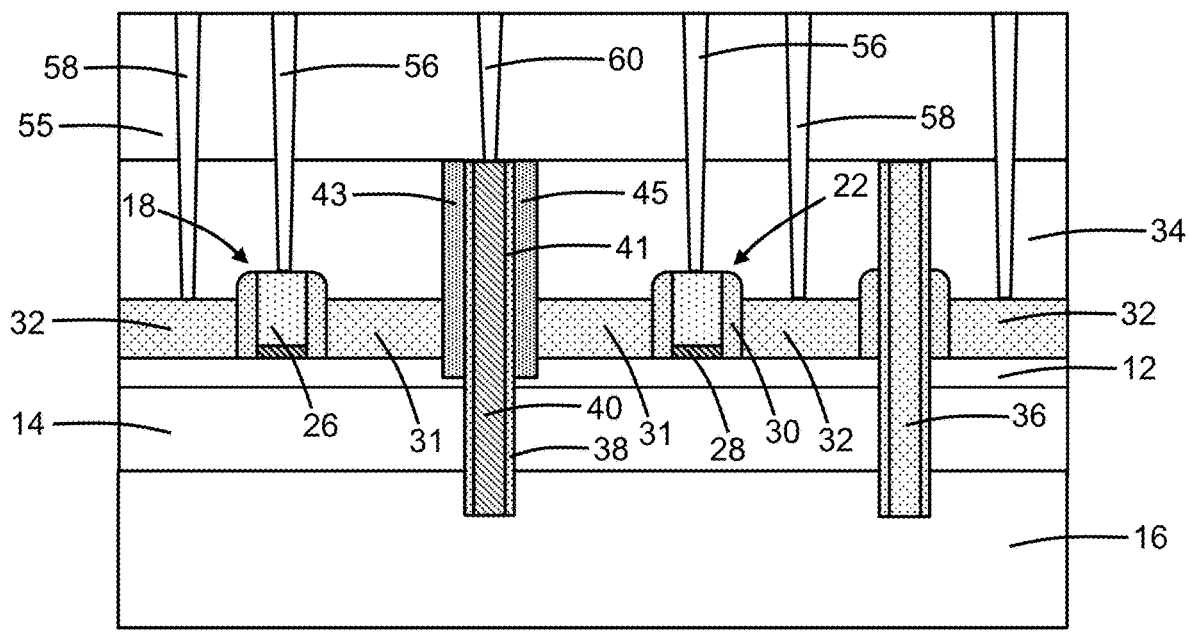
FIG. 6 is a cross-sectional view of the structure at a fabrication stage of the processing method subsequent to FIGS. 5, 5A, 5B.

With reference to FIG. 6 in which like reference numerals refer to like features in FIGS. 5, 5A, 5B and at a subsequent fabrication stage, the structure 10 may further include a contact level having a dielectric layer 55 formed over the dielectric layer 34, contacts 56 in the dielectric layer 34 and dielectric layer 55 that are physically and electrically coupled to the gate electrode 26 in the gate structure 18 of the transistor 48 and the gate electrode 26 in the gate structure 22 of the transistor 50, contacts 58 in the dielectric layer 34 and dielectric layer 55 that are physically and electrically coupled to the semiconductor layers 32 of the transistors 48, 50, and contacts 60 in the dielectric layer 34 and dielectric layer 55 that are physically and electrically coupled to the conductor layer 40 shared by the capacitors 52, 54. The contact level may be formed by middle-of-line processing, and the semiconductor layers 31, 32, the gate electrodes 26, and the conductor layer 40 may be silicided.

In an embodiment, portions of the semiconductor layer 12 beneath the semiconductor layers 31, which are laterally arranged between the capacitors 52 and the transistors 48 and are also laterally arranged between the capacitors 54 and the transistors 50, are not contacted by contacts within the contact level. Instead, the semiconductor layers 31 and/or the underlying portions of the semiconductor layer 12 beneath the semiconductor layers 31 are directly coupled, both physically and electrically, to the conductor layers 43, 45 of the capacitors 52, 54.

The contacts 56, 58, 60 are coupled to wiring in a back-end-of-line stack formed over the contact level. Specifically, the contacts 56 may couple the gate electrodes 26 to word lines in the back-end-of-line stack, and the contacts 58 may couple the semiconductor layers 32 to bit lines in the back-end-of-line stack. The conductor layer 40 shared by the capacitors 52, 54 may be coupled to a ground potential. In an embodiment, the conductor layer 40 shared by the capacitors 52, 54 may be coupled by the contacts 60 to a ground potential. In an alternative embodiment, the contacts 60 may be omitted and the conductor layer 40 may be coupled by the semiconductor substrate 16 to a ground potential. In an alternative embodiment, the contacts 60 may couple the conductor layer 40 to a ground potential and the conductor layer 40 may also be coupled by the semiconductor substrate 16 to a ground potential.

The memory device embodied in the structure 10 incorporates transistors 48, 50, which may be fully-depleted silicon-on-insulator transistors, and at-pitch capacitors 52, 54 each having a capacitor plate formed directly against, or in direct contact with, the source/drain region including the portion of the semiconductor layer 12 beneath one of the semiconductor layers 31. Each of the capacitors 52, 54 includes a shared capacitor plate represented by the conductor layer 40 and a shared capacitor dielectric layer represented by the dielectric layer 38, and the shared capacitor plate and capacitor dielectric layer are self-aligned to a pulled at-pitch gate structure 20. The transistors 48, 50, which are electrically isolated by the dielectric layer 14 from the semiconductor substrate 16, may be characterized by a lower leakage than transistors formed using a bulk substrate.

Figure 7:
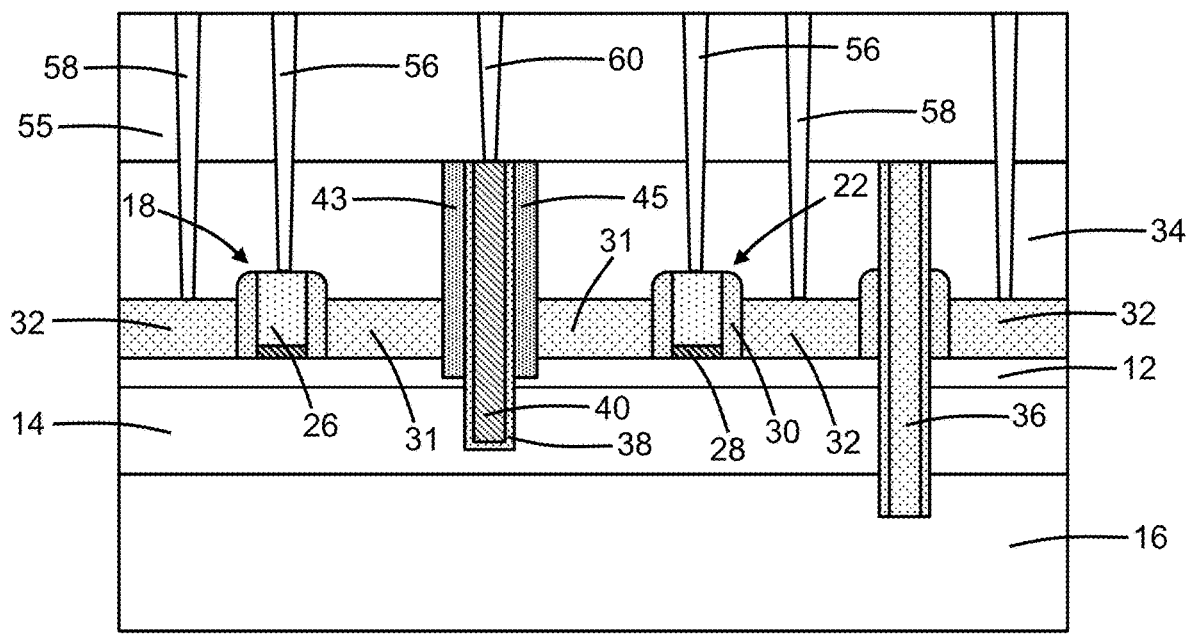
FIG. 7 is a cross-sectional view of a structure in accordance with alternative embodiments of the invention.

With reference to FIG. 7 and in accordance with alternative embodiments, the dielectric layer 38 may not be removed from the bottom of the trench 33 before forming the conductor layer 40. As a result, the bottom portion of the conductor layer 40 is coated by a portion of the dielectric layer 38. The trench 33 may also be shallower and not penetrate into the semiconductor substrate 16 because the conductor layer 40 may be grounded through the contact 60 instead of through the semiconductor substrate 16.

Figure 8:
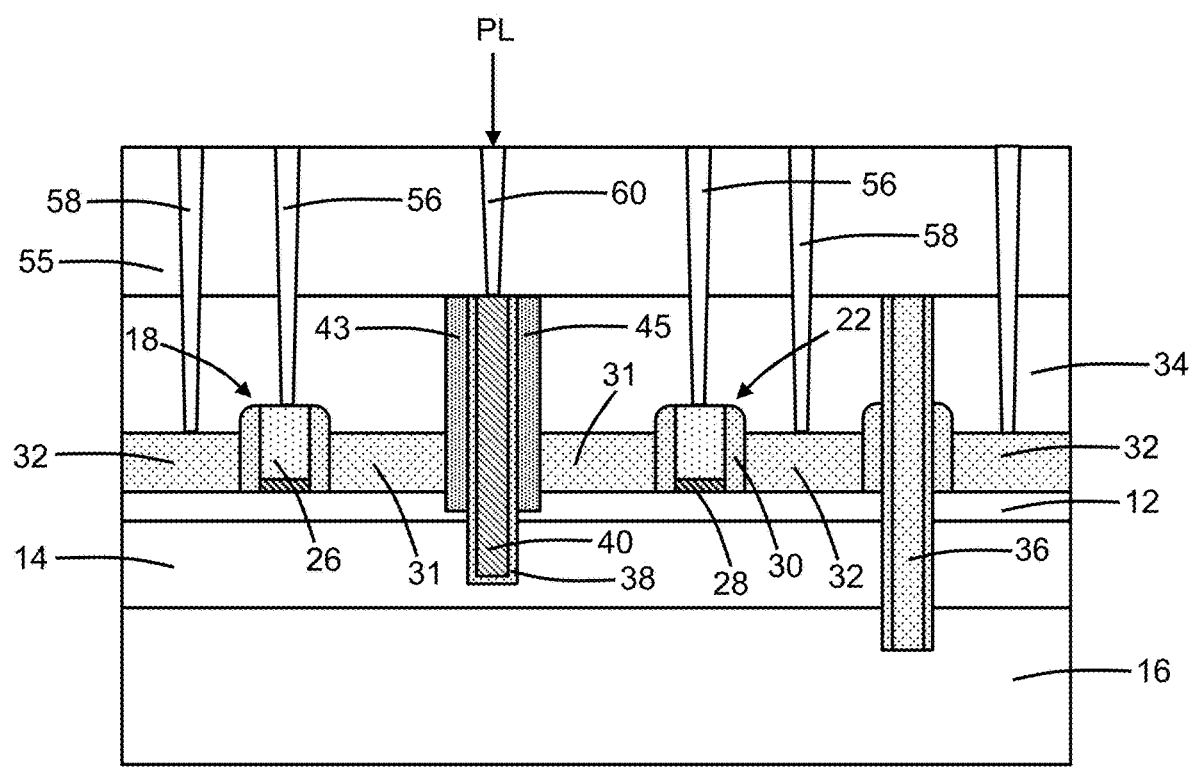
FIG. 8 is a cross-sectional view of a structure in accordance with alternative embodiments of the invention.
Figure 9:
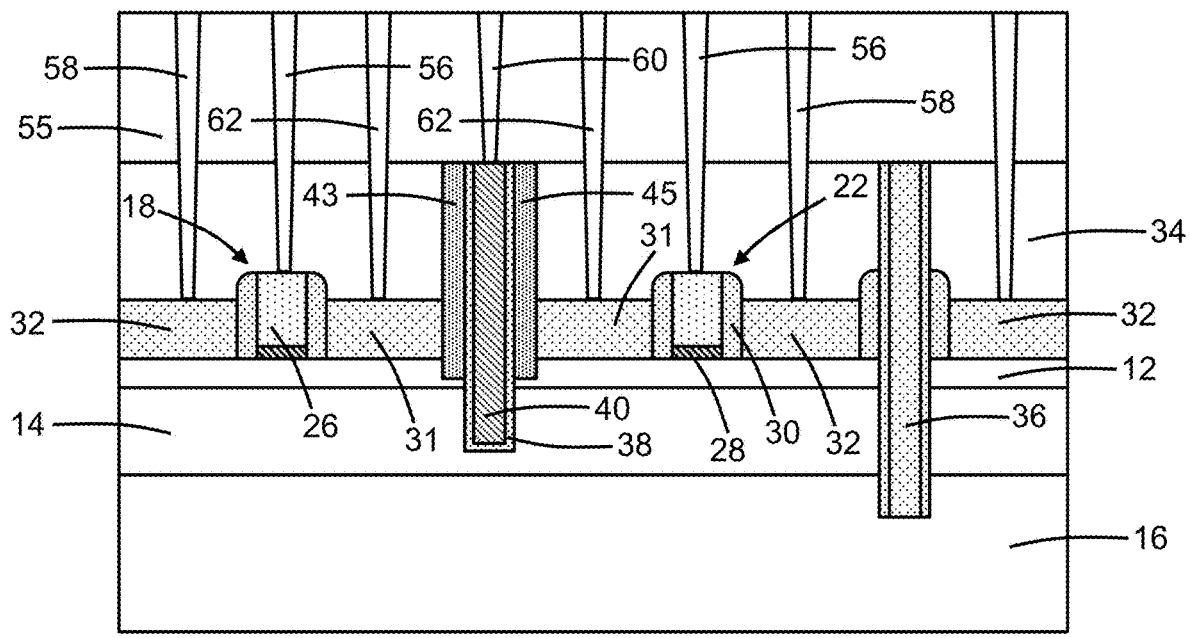
FIG. 9 is a cross-sectional view of a structure in accordance with alternative embodiments of the invention.

With reference to FIG. 8 and in accordance with alternative embodiments, the structure 10 may be deployed in a ferroelectric random access memory device in which the conductor layer 40 is coupled by the contact 60 with a plate line (PL). The dielectric layer 38 may comprise a ferroelectric material that is characterized by a pair of stable remanent polarization states that are persistent and that can be reversibly varied in response to an electric field applied between the respective capacitor plates of each capacitor 52, 54. The pair of stable remanent polarization states represent binary logic states. In one remnant polarization state, the net polarization of the ferroelectric material in its crystalline grains may be oriented parallel to each other, which may provide a low capacitance state. In the other remnant polarization state, the net polarization of the ferroelectric material in its crystalline grains may be oriented anti-parallel to each other, which may provide a high capacitance state. The low and high capacitance states of the remnant polarization states enable different binary logic states. Voltage pulses may be applied from the plate line to the conductor layer 43 of each capacitor 52 to switch the polarization between different states. Voltage pulses may be applied from the plate line to the conductor layer 45 of each capacitor 54 to switch between the different polarization states. With reference to FIG. 9 and in accordance with alternative embodiments, the structure 10 may be deployed as a ferroelectric memory field-effect transistor in which the semiconductor layers 31 adjacent to the capacitors 52, 54 are each coupled by contacts 62 to a read transistor in sensing circuitry that may be used to sense the different capacitance states of the capacitors 52, 54. The contacts 58 may couple the semiconductor layers 32 to a source line. The ferroelectric memory field-effect transistor may be deployed in a circuit for an artificial intelligence or machine learning technology.

Figure 10:
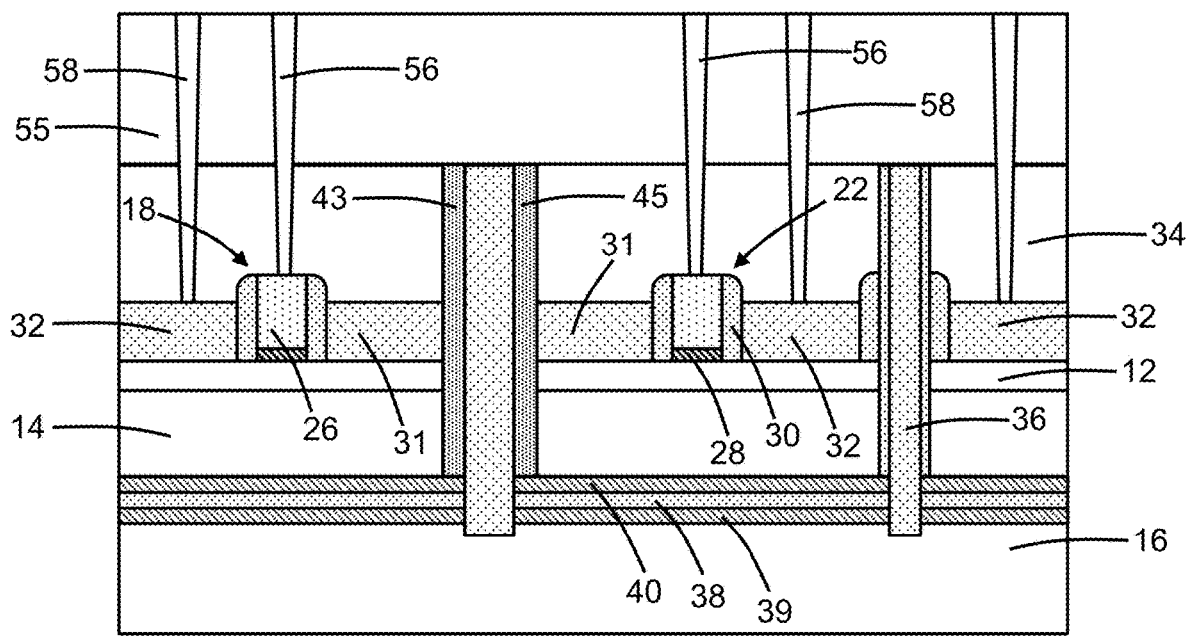
FIG. 10 is a cross-sectional view of a structure in accordance with alternative embodiments of the invention.

With reference to FIG. 10 and in accordance with alternative embodiments, the conductor layer 40 and the dielectric layer 38, and another conductor layer 39 similar to the conductor layer 40, may be formed beneath the dielectric layer 14. The capacitors 52 and the capacitors 54 share the conductor layer 40 as a capacitor plate or electrode, the conductor layer 39 as a capacitor plate or electrode, and the dielectric layer 38 as a capacitor dielectric layer positioned between the conductor layer 39 and the conductor layer 40. The conductor layers 39, 40 and the dielectric layer 38 define a horizontal capacitor. The conductor layer 39 may be grounded through the semiconductor substrate 16. In an embodiment, the conductor layer 40 may adjoin the dielectric layer 14.

Each capacitor 52 includes one of the conductor layers 43 that physically and electrically couples the source/drain region of the transistor 48 directly to the conductor layer 40 and, more specifically, that physically and electrically couples the associated semiconductor layer 31 and the underlying portion of the semiconductor layer 12 of the transistor 48 directly to the conductor layer 40. Each capacitor 54 includes one of the conductor layers 45 that physically and electrically couples the source/drain region of the transistor 50 directly to the conductor layer 40 and, more specifically, that physically and electrically couples the associated semiconductor layer 31 and the underlying portion of the semiconductor layer 12 of the transistor 50 directly to the conductor layer 40. The space inside the trench 33 may be filled by a dielectric material to electrically isolate the conductor layers 43 from the conductor layers 45.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a memory device, the structure comprising:
   a first transistor including a first gate structure and a first source/drain region;
   a second transistor including a second gate structure and a second source/drain region;
   a first capacitor including a first capacitor plate directly coupled to the first source/drain region, a second capacitor plate, and a capacitor dielectric layer, the first capacitor laterally positioned between the first transistor and the second transistor; and
   a second capacitor including a first capacitor plate directly coupled to the second source/drain region, a second capacitor plate shared with the second capacitor plate of the first capacitor, and a capacitor dielectric layer shared with the capacitor dielectric layer of the first capacitor,
   wherein the shared second capacitor plate includes a portion laterally between the first capacitor plate of the first capacitor and the first capacitor plate of the second capacitor, the shared capacitor dielectric layer includes a first portion laterally between the first capacitor plate of the first capacitor and the portion of the shared second capacitor plate, and the capacitor dielectric layer includes a second portion laterally between the first capacitor plate of the second capacitor and the portion of the shared second capacitor plate.

2. The structure of claim 1 wherein the capacitor dielectric layer comprises a ferroelectric material.

3. The structure of claim 1 wherein the portion of the second capacitor plate, the first portion of the capacitor dielectric layer, the second portion of the capacitor dielectric layer, the first capacitor plate of the first capacitor, and the first capacitor plate of the second capacitor are positioned laterally between the first source/drain region and the second source/drain region.

4. The structure of claim 1 further comprising:
   a silicon-on-insulator substrate including a semiconductor substrate, a first dielectric layer on the semiconductor substrate, and a semiconductor layer on the first dielectric layer,
   wherein the first source/drain region includes a portion of the semiconductor layer.

5. The structure of claim 4 wherein the shared second capacitor plate and the shared capacitor dielectric layer are positioned in a trench, and the trench includes a first portion in the semiconductor layer.

6. The structure of claim 5 wherein the trench includes a second portion in the first dielectric layer and a third portion in the semiconductor substrate, and the shared second capacitor plate is in contact with the semiconductor substrate.

7. The structure of claim 6 further comprising:
   a second dielectric layer on the semiconductor layer; and
   a first contact in the second dielectric layer, the contact coupled to the shared second capacitor plate.

8. The structure of claim 7 wherein the first source/drain region includes a raised semiconductor layer on the portion of the semiconductor layer, and further comprising:
   a second contact in the second dielectric layer, the second contact coupled by the raised semiconductor layer to the first source/drain region.

9. A structure for a memory device, the structure comprising:
   a first transistor including a first gate structure and a first source/drain region;
   a second transistor including a second gate structure and a second source/drain region;
   a first capacitor including a first capacitor plate directly coupled to the first source/drain region, a second capacitor plate, and a capacitor dielectric layer between the first capacitor plate of the first capacitor and the second capacitor plate;
   a second capacitor including a first capacitor plate directly coupled to the second source/drain region, a second capacitor plate that is shared with the second capacitor plate of the first capacitor, and a capacitor dielectric layer that is shared with the capacitor dielectric layer of the first capacitor, the capacitor dielectric layer the second capacitor between the first capacitor plate of the second capacitor and the second capacitor plate the second capacitor;
   a dielectric spacer that surrounds the first gate structure of the first transistor, the dielectric spacer having a first thickness; and
   a dielectric layer between the first capacitor plate of the first capacitor and the second capacitor plate of the second capacitor, the dielectric layer having a second thickness that is substantially equal to the first thickness,
   wherein the second capacitor plate has a length, and the first capacitor plate of the second capacitor is spaced along the length of the second capacitor plate from the first capacitor plate of the first capacitor.

10. A method of forming a structure for a memory device, the method comprising:
    forming a first transistor including a first gate structure and a first source/drain region;
    forming a second transistor including a second gate structure and a second source/drain region;
    forming a first capacitor including a first capacitor plate directly coupled to the first source/drain region, a second capacitor plate, and a capacitor dielectric layer, wherein the first capacitor is laterally positioned between the first transistor and the second transistor; and
    forming a second capacitor including a first capacitor plate directly coupled to the second source/drain region, a second capacitor plate shared with the second capacitor plate of the first capacitor, and a capacitor dielectric layer shared with the capacitor dielectric layer of the first capacitor,
    wherein the shared second capacitor plate includes a portion laterally between the first capacitor plate of the first capacitor and the first capacitor plate of the second capacitor, the shared capacitor dielectric layer includes a first portion laterally between the first capacitor plate of the first capacitor and the portion of the shared second capacitor plate, and the shared capacitor dielectric layer includes a second portion laterally between the first capacitor plate of the second capacitor and the portion of the shared second capacitor plate.

11. The method of claim 10 wherein forming the first capacitor including the first capacitor plate directly coupled to the first source/drain region, the second capacitor plate, and the capacitor dielectric layer plate comprises:
    removing a third gate structure; and
    forming the second capacitor plate that includes a portion in a space formed when the third gate structure is removed, wherein the first capacitor plate and a portion of the capacitor dielectric layer are positioned between the portion of the second capacitor plate and the first source/drain region.

12. The structure of claim 1 wherein the shared second capacitor plate comprises doped amorphous silicon.

13. The structure of claim 1 wherein the shared second capacitor plate comprises tungsten.

14. The structure of claim 1 wherein the first capacitor plate of the first capacitor and the first capacitor plate of the second capacitor comprise doped silicon.

15. The structure of claim 14 wherein the shared second capacitor plate comprises doped amorphous silicon.

16. The structure of claim 14 wherein the shared second capacitor plate comprises tungsten.

17. The structure of claim 1 wherein the first capacitor plate of the first capacitor and the first capacitor plate of the second capacitor comprise titanium.

18. The structure of claim 17 wherein the shared second capacitor plate comprises doped amorphous silicon.

19. The structure of claim 17 wherein the shared second capacitor plate comprises tungsten.

20. The structure of claim 4 wherein the first capacitor plate of the first capacitor is positioned in a first trench, the first capacitor plate of the second capacitor is positioned in a second trench, and the first trench and the second trench penetrate partially through the semiconductor layer.

* * * * *